_(12)_ United States Patent
Oishi et al.

(10) Patent No.: US 11,201,460 B2
(45) Date of Patent: Dec. 14, 2021

(54) POWER SOURCE SWITCH CONTROL DEVICE

(71) Applicant: Yazaki Corporation, Tokyo (JP)

(72) Inventors: Eiichiro Oishi, Shizuoka (JP); Mitsuaki Morimoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 35 days.

(21) Appl. No.: 16/823,830

(22) Filed: Mar. 19, 2020

(65) Prior Publication Data

US 2020/0220348 A1 Jul. 9, 2020

Related U.S. Application Data

(63) Continuation of application No. PCT/JP2018/026747, filed on Jul. 17, 2018.

(30) Foreign Application Priority Data

Oct. 24, 2017 (JP) .............................. JP2017-205005

(51) Int. Cl.
*H02H 3/08* (2006.01)
*H02H 9/02* (2006.01)
(Continued)

(52) U.S. Cl.
CPC ............ *H02H 7/20* (2013.01); *H01H 47/002* (2013.01); *H02H 3/08* (2013.01); *H02J 1/00* (2013.01);
(Continued)

(58) Field of Classification Search
CPC .. H02H 7/20; H02J 1/00; H02J 7/0031; H01H 47/002
(Continued)

(56) References Cited

U.S. PATENT DOCUMENTS

2012/0206118 A1* 8/2012 Williams ................ H02J 3/381
323/282
2012/0326531 A1 12/2012 Kawamoto et al.
2018/0152014 A1* 5/2018 Miyoshi ................... H02H 3/16

FOREIGN PATENT DOCUMENTS

JP 2000-134707 A 5/2000
JP 2007-159326 A 6/2007
(Continued)

OTHER PUBLICATIONS

International Search Report for PCT/JP2018/026747 dated Aug. 21, 2018 [PCT/ISA/210].

*Primary Examiner* — Jared Fureman
*Assistant Examiner* — Lucy M Thomas
(74) *Attorney, Agent, or Firm* — Sughrue Mion, PLLC

(57) ABSTRACT

A power source switch control device includes a detection circuit, a detection circuit, a detection circuit, and a detection circuit. The detection circuit detects forward voltage of a body diode of a FET, and the detection circuit detects forward voltage of a body diode of a FET. The detection circuit detects forward voltage of a body diode of a FET, and the detection circuit detects forward voltage of a body diode of a FET. A controller determines whether a defect of a power circuit has occurred based on results of the detection by the detection circuits to. Accordingly, the power source switch control device can appropriately detect defect of a switching element of a power source.

13 Claims, 9 Drawing Sheets

(51) Int. Cl.
*H02H 7/20* (2006.01)
*H01H 47/00* (2006.01)
*H02J 1/00* (2006.01)
*H02J 7/00* (2006.01)
*H03K 17/082* (2006.01)

(52) U.S. Cl.
CPC ........ *H02J 7/0031* (2013.01); *H03K 17/0822* (2013.01)

(58) Field of Classification Search
USPC ....................................................... 361/93.1
See application file for complete search history.

(56) References Cited

FOREIGN PATENT DOCUMENTS

| | | |
|---|---|---|
| JP | 2013-009467 A | 1/2013 |
| JP | 2015-100240 A | 5/2015 |

\* cited by examiner

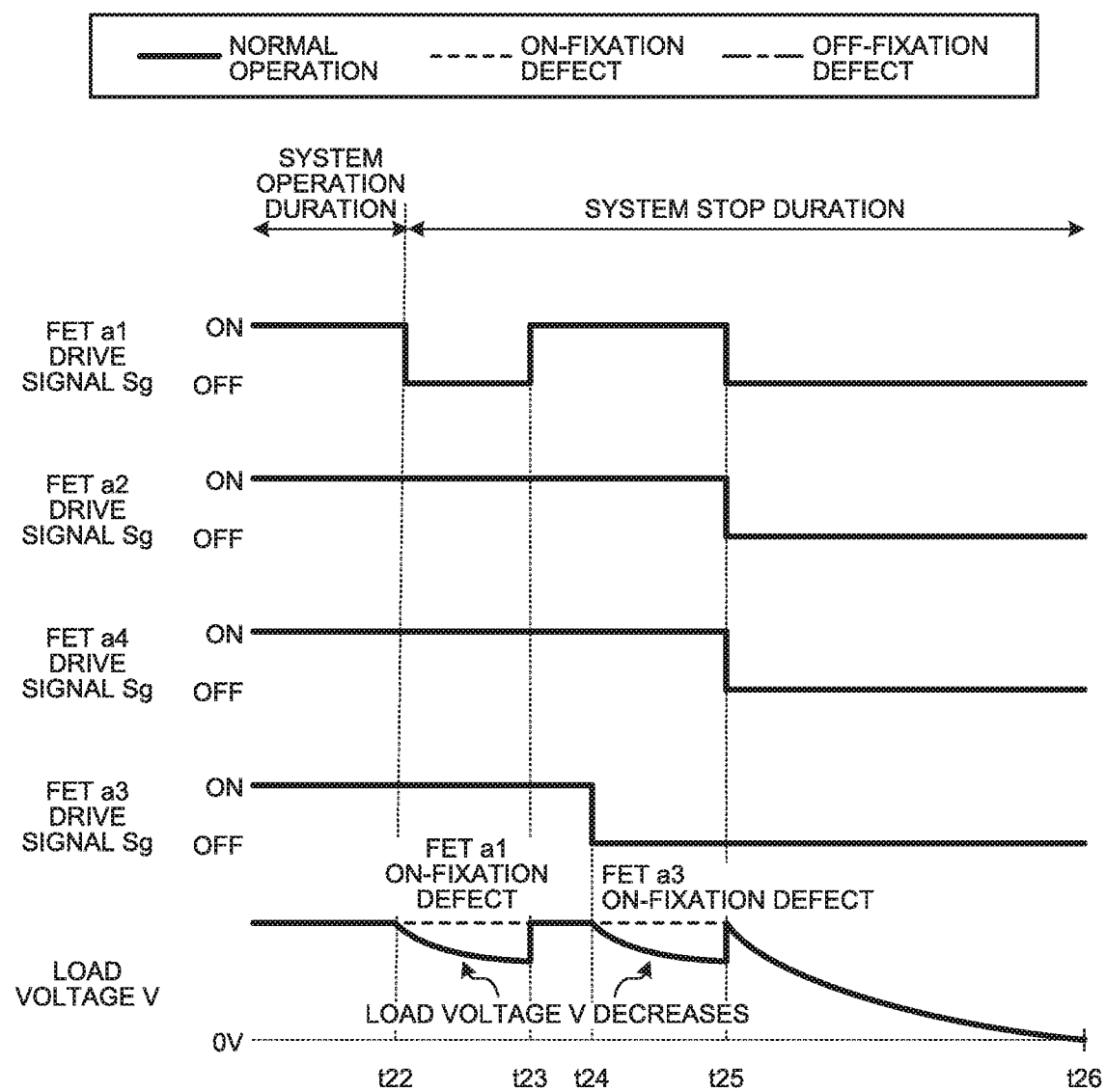

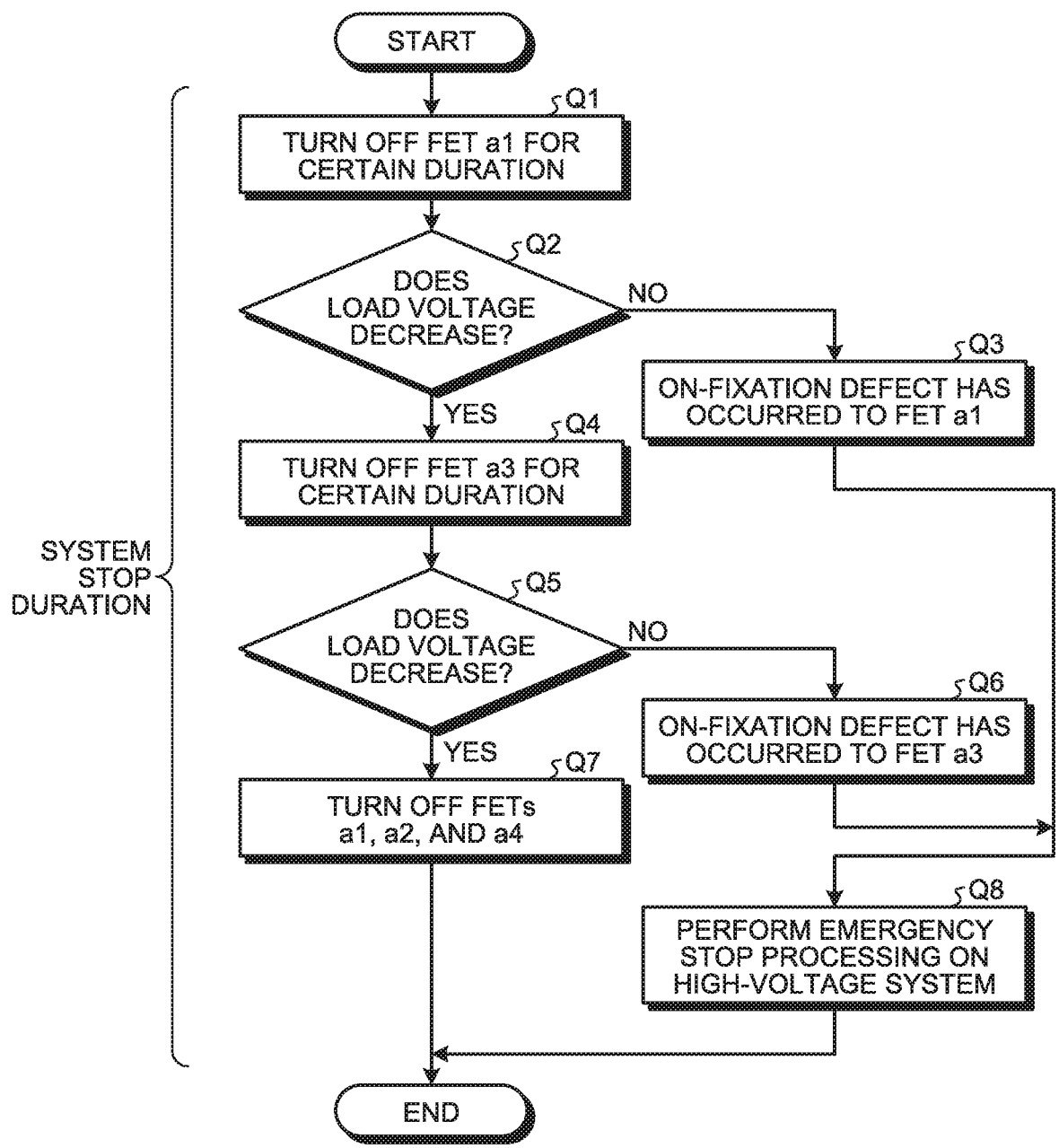

POWER SOURCE SWITCH CONTROL DEVICE

CROSS-REFERENCE TO RELATED APPLICATION

This application is a continuation application of International Application PCT/JP2018/G26747, filed on Jul. 17, 2018 which claims the benefit of priority from Japanese Patent application No. 2017-205005 filed on Oct. 24, 2017 and designating the U.S., the entire contents of which are incorporated herein by reference.

BACKGROUND OF THE INVENTION

1. Field of the Invention

The present invention relates to a power source switch control device.

2. Description of the Related Art

For example, Japanese Patent Application Laid-open No. 2000-134707 discloses, as a conventional power source switch control device, a power source control device configured to sense welding of a mechanical relay configured to control power source supply. Recently, a semiconductor relay including a switching element has been used in place of a mechanical relay in some cases. In the semiconductor relay, the switching element is turned on or off to control power source supply.

For example, when the above-described semiconductor relay is connected with a high-voltage power source and includes a plurality of switching elements, it is difficult to specify a defective switching element, and this leaves room for further improvement.

SUMMARY OF THE INVENTION

Thus, the present invention is intended to solve the above-described problem and provide a power source switch control device that can appropriately detect a defective switching element of a power source.

In order to solve the above mentioned problem and achieve the object, a power source switch control device according to one aspect of the present invention includes an upstream-side bidirectional cutoff circuit provided between a positive electrode of a direct-current power source and a load unit in a power circuit in which the direct-current power source and the load unit are connected with each other and configured to allow or cut off conduction of power source current flowing from the direct-current power source to the load unit and regeneration current flowing from the load unit to the direct-current power source; a downstream-side bidirectional cutoff circuit provided between a negative electrode of the direct-current power source and the load unit and configured to allow or cut off conduction of the power source current and the regeneration current; and a controller configured to control the upstream-side bidirectional cutoff circuit and the downstream-side bidirectional cutoff circuit, wherein the upstream-side bidirectional cutoff circuit includes: a first switching element configured to allow or cut off conduction of the power source current; a second switching element connected in series with the first switching element and configured to allow or cut off conduction of the regeneration current; a first diode provided to have a conduction direction opposite to a direction in which the power source current flows and connected in parallel with the first switching element; a second diode provided to have a conduction direction opposite to a direction in which the regeneration current flows and connected in parallel with the second switching element; a first detection unit connected in parallel with the first diode and configured to detect forward voltage of the first diode; and a second detection unit connected in parallel with the second diode and configured to detect forward voltage of the second diode, the downstream-side bidirectional cutoff circuit includes: a third switching element configured to allow or cut off conduction of the power source current; a fourth switching element connected in series with the third switching element and configured to allow or cut off conduction of the regeneration current; a third diode provided to have a conduction direction opposite to the direction in which the power source current flows and connected in parallel with the third switching element; a fourth diode provided to have a conduction direction opposite to the direction in which the regeneration current flows and connected in parallel with the fourth switching element; a third detection unit connected in parallel with the third diode and configured to detect forward voltage of the third diode; and a fourth detection unit connected in parallel with the fourth diode and configured to detect forward voltage of the fourth diode, and in four durations of an activation preparation duration in which activation of the power circuit is prepared from an off state of the power circuit with the first to the fourth switching elements all off, a precharge duration in which inrush current flowing from the direct-current power source to the load unit is avoided after the activation preparation duration ends, a system operation duration in which the power circuit normally operates after the precharge duration ends, and a system stop duration in which the power circuit normally operating is stopped, the controller determines whether a defect has occurred in the power circuit based on at least one of results of the detection by the first detection unit, the second detection unit, the third detection unit, and the fourth detection unit in the case of the precharge duration and the system operation duration, or determines whether a defect has occurred in the power circuit based on results of the detection by a detection unit which is different from the first detection unit, the second detection unit, the third detection unit, and the fourth detection unit in the case of the activation preparation duration and the system stop duration.

According to another aspect of the present invention, in the power source switch control device, it is preferable that when turning on the first switching element, the second switching element, the third switching element, and the fourth switching element and causing the power source current to flow through the power circuit in the case of the precharge duration and the system operation duration, the controller determines that off-fixation defect has occurred in which the second switching element is firmly fixed to an off state and not turned on, upon detection of the forward voltage of the second diode by the second detection unit, or determines that off-fixation defect has occurred in which the fourth switching element is firmly fixed to an off state and not turned on, upon detection of the forward voltage of the fourth diode by the fourth detection unit.

According to still another aspect of the present invention, in the power source switch control device, it is preferable that when turning on the first switching element and the third switching element and turning off the second switching element and the fourth switching element and causing the power source current to flow through the power circuit in the case of the precharge duration and the system operation duration, the controller determines that on-fixation defect has occurred in which the second switching element is firmly fixed to an on state and not turned off, upon no detection of the forward voltage of the second diode by the second detection unit, or determines that on-fixation defect has occurred in which the fourth switching element is firmly fixed to an on state and not turned off, upon no detection of the forward voltage of the fourth diode by the fourth detection unit.

According to still another aspect of the present invention, in the power source switch control device, it is preferable that when turning on the first switching element, the second switching element, the third switching element, and the fourth switching element and causing the regeneration current to flow through the power circuit in the case of the system operation duration, the controller determines that off-fixation defect has occurred in which the first switching element is firmly fixed to an off state and not turned on, upon detection of the forward voltage of the first diode by the first detection unit, or determines that off-fixation defect has occurred in which the third switching element is firmly fixed to an off state and not turned on, upon detection of the forward voltage of the third diode by the third detection unit.

According to still another aspect of the present invention, in the power source switch control device, it is preferable that when turning on the second switching element and the fourth switching element and turning off the first switching element and the third switching element and causing the regeneration current to flow through the power circuit in the case of the system operation duration, the controller determines that on-fixation defect has occurred in which the first switching element is firmly-fixed to an on state and not turned off, upon no detection of the forward voltage of the first diode by the first detection unit, or determines that on-fixation defect has occurred in which the third switching element is firmly fixed to an on state and not turned off, upon no detection of the forward voltage of the third diode by the third detection unit.

According to still another aspect of the present invention, in the power source switch control device, it is preferable that the power source switch control device includes a current sensor configured to detect the power source current flowing through the power circuit, wherein when turning on the first switching element, the second switching element, the third switching element, and the fourth switching element and causing the power source current to flow through the power circuit in the case of the precharge duration, the controller determines that off-fixation defect has occurred in which at least one of the first switching element or the third switching element is firmly fixed to an off state and not turned on, upon no detection of the power source current by the current sensor.

According to still another aspect of the present invention, in the power source switch control device, it is preferable that the power source switch control device includes a current sensor configured to detect the power source current flowing through the power circuit, wherein when turning on the first switching element and turning off the second switching element, the third switching element, and the fourth switching element and causing the power source current to flow through the power circuit in the case of the activation preparation duration, the controller determines that on-fixation defect has occurred in which the third switching element is firmly fixed to an on state and not turned off, upon detection of the power source current by the current sensor, when turning on the third switching element and turning off the first switching element, the second switching element, and the fourth switching element and causing the power source current to flow through the power circuit in the case of the activation preparation duration, the controller determines that on-fixation defect has occurred in which the first switching element is firmly fixed to an on state and not turned off, upon detection of the power source current by the current sensor.

According to still another aspect of the present invention, in the power source switch control device, it is preferable that the power source switch control device includes a voltage monitoring circuit configured to detect load voltage of the power circuit, wherein when turning off the first switching element and turning on the second switching element, the third switching element, and the fourth switching element and causing the power source current to flow through the power circuit in the case of the system stop duration, the controller determines that on-fixation defect has occurred in which the first switching element is firmly fixed to an on state and not turned off, upon no detection of a reduction of the load voltage by the voltage monitoring circuit, when turning off the third switching element and turning on the first switching element, the second switching element, and the fourth switching element and causing the power source current to flow through the power circuit in the case of the system stop duration, the controller determines that on-fixation defect has occurred in which the third switching element is firmly fixed to an on state and not turned off, upon no detection of a reduction of the load voltage by the voltage monitoring circuit.

The above and other objects, features, advantages and technical and industrial significance of this invention will be better understood by reading the following detailed description of presently preferred embodiments of the invention, when considered m connection with the accompanying drawings.

BRIEF DESCRIPTION OF THE DRAWINGS

FIG. 8 is a sequence chart illustrating an exemplary operation of the power source switch control device according to the embodiment; and FIG. 9 is a flowchart illustrating the exemplary operation of the power source switch control device according to the embodiment.

DETAILED DESCRIPTION OF THE PREFERRED EMBODIMENTS

Figure 1:
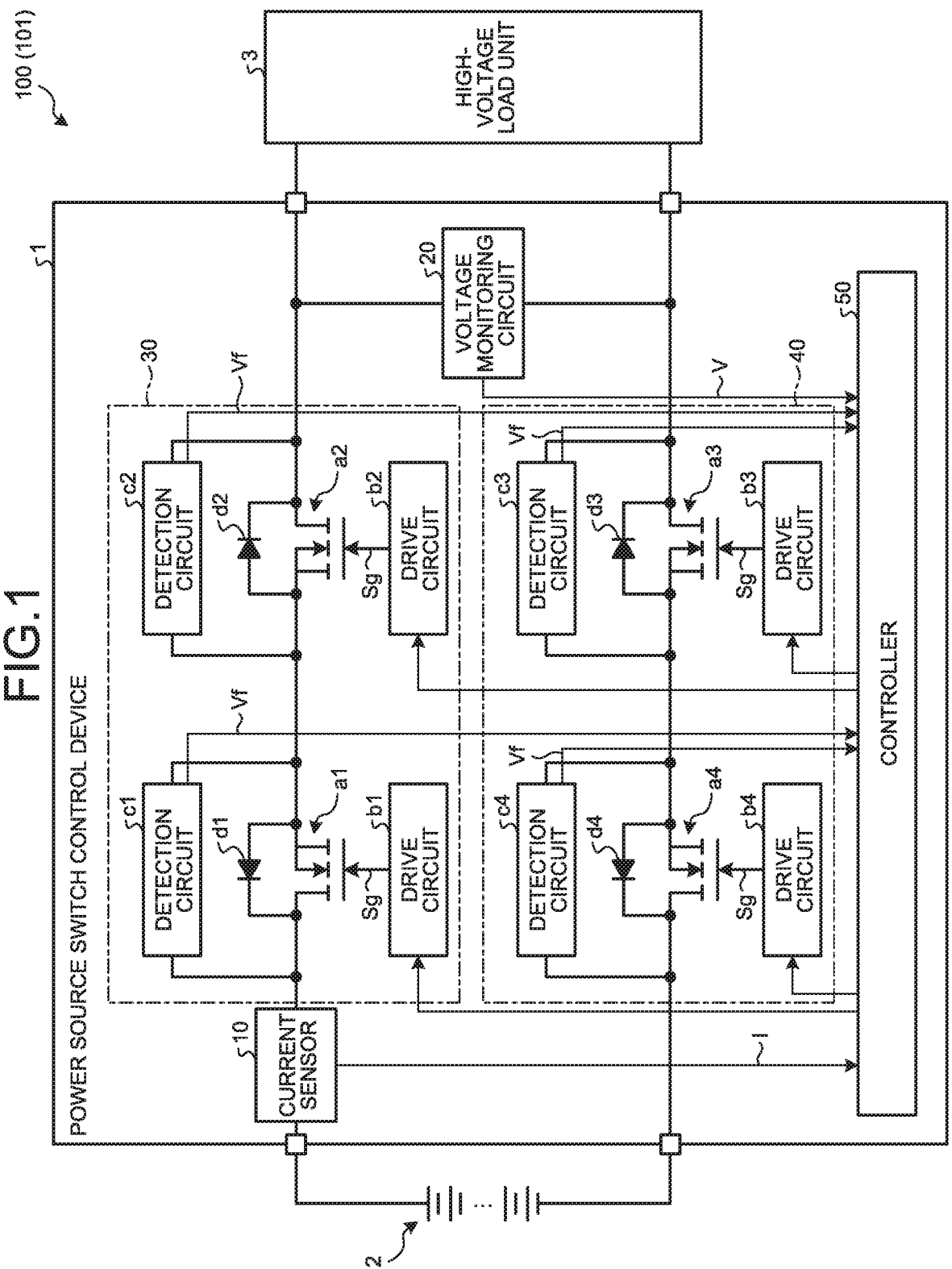
FIG. 1 is a circuit diagram illustrating an exemplary configuration of a power source switch control device according to an embodiment.

The following describes a node (embodiment) for carrying out the present invention in detail with reference to the accompanying drawings. The present invention is not limited by contents described below in the embodiment. Components described below include those that could be easily thought of by the skilled person in the art and those identical in effect. Configurations described below may be combined with each other as appropriate. In addition, it is possible to perform various kinds of omissions, replacements, and changes of the configurations without departing from the scope of the present invention.

Embodiment

The following describes a power source switch control device 1 according to the embodiment. For example, a vehicle such as an electric vehicle or a hybrid electric vehicle is sometimes provided with a high-voltage system 100 having a function to drive a high-voltage load unit 3 by supplying power source electricity from a high-voltage battery 2 to the high-voltage load unit 3 and a function to charge the high-voltage battery 2 by supplying regenerative electricity from the high-voltage load unit 3 to the high-voltage battery 2. The high-voltage system 100 includes the high-voltage battery 2 as a direct-current power source, the high-voltage load unit 3 as a load unit, and the power source switch control device 1. The high-voltage system 100 functions as a power circuit 101 in which the high-voltage battery 2 and the high-voltage load unit 3 are electrically connected with each other through the power source switch control device 1.

The high-voltage battery 2 is a high-voltage secondary battery that can be charged and discharged, and is achieved by, for example, a lithium-ion assembled battery or nickel-hydrogen assembled battery configured by connecting a plurality of batteries. The high-voltage battery 2 has a terminal voltage of, for example, several hundred V. The high-voltage battery 2 is connected with the high-voltage load unit 3 through the power source switch control device 1 and supplies electricity to the high-voltage load unit 3. The high-voltage battery 2 is charged by regenerative electricity supplied from the high-voltage load unit 3.

The high-voltage load unit 3 is a high-voltage load unit and is, for example, an inverter configured to convert direct current into alternating current and supply electricity to a drive motor. The high-voltage load unit 3 is connected with the high-voltage battery 2 through the power source switch control device 1, converts direct-current power supplied from the high-voltage battery 2 into alternating-current electricity, and supplies the alternating-current power to the drive motor. In addition, the high-voltage load unit 3 converts alternating-current regenerative electricity supplied from the drive motor into direct-current power and supplies the direct-current power to the high-voltage battery 2.

The power source switch control device 1 is a semiconductor relay device configured to allow or cut off conduction of current flowing in both directions between the high-voltage battery 2 and the high-voltage load unit 3 for safety. As illustrated in FIG. 1, the power source switch control device 1 includes a current sensor 10, a voltage monitoring circuit 20, an upstream-side bidirectional cutoff circuit 30, a downstream-side bidirectional cutoff circuit 40, and a controller 50.

The current sensor 10 detects current flowing through the power circuit 101. For example, the current sensor 10 is provided in series between the positive electrode of the high-voltage battery 2 and the high-voltage load unit 3. The current sensor 10 is connected with the controller 50, detects load current I as current flowing through the power circuit 101, and outputs the load current I as a result of the detection to the controller 50.

The voltage monitoring circuit 20 detects load voltage V of the power circuit 101. The voltage monitoring circuit is connected in parallel with the high-voltage load unit 3 and detects the load voltage V applied to the high-voltage load unit 3. The voltage monitoring circuit 20 is connected with the controller 50 and outputs the load voltage V as a result of the detection to the controller 50.

The upstream-side bidirectional cutoff circuit 30 allows or cuts off conduction of current flowing in both directions in the power circuit 101. The upstream-side bidirectional cutoff circuit 30 is provided between the positive electrode of the high-voltage battery 2 and the high-voltage load unit 3 in the power circuit 101. The upstream-side bidirectional cutoff circuit 30 allows or cuts off conduction of power source current flowing from the high-voltage battery 2 to the high-voltage load unit 3 and regeneration current flowing from the high-voltage load unit 3 to the high-voltage battery 2. The upstream-side bidirectional cutoff circuit 30 includes a field-effect transistor (FET) a1 as a first switching element, a FET a2 as a second switching element, a drive circuit b1, a drive circuit b2, a detection circuit c1 as a first detection unit, and a detection circuit c2 as a second detection unit. The FETs a1 and a2 are, for example, N-channel metal-oxide-semiconductor (MOS) FETs.

The FET a1 is a switch configured to allow or cut off conduction of the power source current. The FET a1 has a drain terminal connected with the high-voltage battery 2 through the current sensor 10 and has a source terminal connected with the high-voltage load unit 3 through the FET a2. In the FET a1, a body diode (parasitic diode) d1 as a first diode is formed between the drain terminal and the source terminal. The body diode d1 is provided to have a conduction direction opposite to a direction in which the power source current flows and is connected in parallel with the FET a1. Specifically, the body diode d1 is connected in parallel with the FET a1 while having a cathode terminal provided on the high-voltage battery 2 side and an anode terminal provided on the high-voltage load unit 3 side. In other words, the cathode terminal of the body diode d1 is connected with the drain terminal of the FET a1, and the anode terminal of the body diode d1 is connected with the source terminal of the FET a1. The FET a1 has a gate terminal connected with the drive circuit b1 to be described later and is driven by the drive circuit b1. The FET a1 is turned on or off upon being driven by the drive circuit b1 to allow or cut off conduction of the power source current flowing from the high-voltage battery 2 to the high-voltage load unit 3 upstream of the power circuit 101. The FET a1 has no function to cut off the regeneration current but allows conduction thereof. For example, when the FET a1 is off while the regeneration current flows, the regeneration current flows through the body diode d1. Alternatively, when the FET a1 is on while the regeneration current flows, the regeneration current does not flow through the body diode d1 but flows between the drain terminal and the source terminal.

The FET a2 is a switch configured to allow or cut off conduction of the regeneration current. The FET a2 is connected in series with the FET a1. For example, the FET a2 has a drain terminal connected with the high-voltage load unit 3 and has a source terminal connected with the FET a1. In the FET a2, a body diode d2 as a second diode is formed between the drain terminal and the source terminal. The body diode d2 is provided to have a conduction direction opposite to a direction in which the regeneration current flows and is connected in parallel with the FET a2. Specifically, the body diode d2 is connected in parallel with the FET a2 while having a cathode terminal provided on the high-voltage load unit 3 side and an anode terminal provided on the high-voltage battery 2 side. In other words, the cathode terminal of the body diode d2 is connected with the drain terminal of the FET a2, and the anode terminal of the body diode d2 is connected with the source terminal of the FET a2. The FET a2 has a gate terminal connected with the drive circuit b2 to be described later and is driven by the drive circuit b2. The FET a2 is turned on or off upon being driven by the drive circuit b2 to allow or cut off conduction of the regeneration current flowing from the high-voltage load unit 3 to the high-voltage battery 2 upstream of the power circuit 101. The FET a2 has no function to cut off the power source current but allows conduction thereof. For example, when the FET a2 is off while the power source current flows, the power source current flows through the body diode d2. Alternatively, when the FET a2 is on while the power source current flows, the power source current does not flow through the body diode d2 but flows between the drain terminal and the source terminal.

The drive circuit b1 drives the FET a1. The drive circuit b1 is connected with the gate terminal of the FET a1 and drives the FET a1 based on ON and OFF commands from the controller 50 to be described later. When the ON command is output from the controller 50, the drive circuit b1 turns on the FET a1 by outputting a drive signal Sg (ON) to the FET a1. For example, the drive circuit b1 turns on the FET a1 by applying ON voltage to the gate terminal of the FET a1. When the OFF command is output from the controller 50, the drive circuit b1 turns off the FET a1 by outputting a drive signal Sg (OFF) to the FET a1. For example, the drive circuit b1 turns off the FET a1 by applying OFF voltage to the gate terminal of the FET a1. To prevent flow of excessive power source current (inrush current) through the power circuit 101 at a timing when the FET a1 is turned on, the drive circuit b1 adjusts the ON voltage applied to the gate terminal to keep the load current I at a certain value or smaller.

The drive circuit b2 drives the FET a2. The drive circuit b2 is connected with the gate terminal of the FET a2 and drives the FET a2 based on ON and OFF commands from the controller 50 to be described later. When the ON command is output from the controller 50, the drive circuit b2 turns on the FET a2 by outputting a drive signal Sg (ON) to the FET a2. For example, the drive circuit b2 turns on the FET a2 by applying ON voltage to the gate terminal of the FET a2. When the OFF command is output from the controller 50, the drive circuit b2 turns off the FET a2 by outputting a drive signal Sg (OFF) to the FET a2. For example, the drive circuit b2 turns off the FET a2 by applying OFF voltage to the gate terminal of the FET a2.

The detection circuit c1 detects voltage. The detection circuit c1 is connected in parallel with the body diode d1 and detects a forward voltage Vf as voltage fall of the body diode d1. For example, the detection circuit c1 is connected with the anode and cathode terminals of the body diode d1 and detects the forward voltage Vf as voltage fall between the anode and cathode terminals. The detection circuit c1 is connected with the controller 50 and outputs the forward voltage Vf of the body diode d1 as a result of the detection to the controller 50.

The detection circuit c2 detects voltage. The detection circuit c2 is connected in parallel with the body diode d2 and detects forward voltage Vf as voltage fall of the body diode d2. For example, the detection circuit c2 is connected with the anode and cathode terminals of the body diode d2 and detects the forward voltage Vf as voltage fall between the anode and cathode terminals. The detection circuit c2 is connected with the controller 50 and outputs the forward voltage Vf of the body diode d2 as a result of the detection to the controller 50.

The downstream-side bidirectional cutoff circuit 40 allows or cuts off conduction of current flowing in both directions in the power circuit 101. The downstream-side bidirectional cutoff circuit 40 is provided between the negative electrode of the high-voltage battery 2 and the high-voltage load unit 3 in the power circuit 101. The downstream-side bidirectional cutoff circuit 40 allows or cuts off conduction of the power source current flowing from the high-voltage battery 2 to the high-voltage load unit 3 and the regeneration current flowing from the high-voltage load unit 3 to the high-voltage battery 2. The downstream-side bidirectional cutoff circuit 40 includes a FET a3 as a third switching element, a FET a4 as a fourth switching element, a drive circuit b3, a drive circuit b4, a detection circuit c3 as a third detection unit, and a detection circuit c4 as a fourth detection unit. The FETs a3 and a4 are, for example, N-channel MOSFETs.

The FET a3 is a switch configured to allow or cut off conduction of the power source current. The FET a3 has a drain terminal connected with the high-voltage load unit 3 and has a source terminal connected with the high-voltage battery 2 through the FET a4. In the FET a3, a body diode d3 as a third diode is formed between the drain terminal and the source terminal. The body diode d3 is provided to have a conduction direction opposite to the direction in which the power source current flows and is connected in parallel with the FET a3. Specifically, the body diode d3 is connected in parallel with the FET a3 while having a cathode terminal provided on the high-voltage load unit 3 side and an anode terminal provided on the high-voltage battery 2 side. In other words, the cathode terminal of the body diode d3 is connected with the drain terminal of the FET a3, and the anode terminal of the body diode d3 is connected with the source terminal of the FET a3. The FET a3 has a gate terminal connected with the drive circuit b3 to be described later and is driven by the drive circuit b3. The FET a3 is turned on or off upon being driven by the drive circuit b3 to allow or cut off conduction of the power source current flowing from the high-voltage battery 2 to the high-voltage load unit 3 downstream of the power circuit 101. The FET a3, has no function to cut off the regeneration current but allows conduction thereof. For example, when the FET a3 is off while the regeneration current flows, the regeneration current flows through the body diode d3. When the FET a3 is on while the regeneration current flows, the regeneration current does not flow through the body diode d3 but flows between the drain terminal and the source terminal.

The FET a4 is a switch configured to allow or cut off conduction of the regeneration current. The FET a4 is connected in series with the FET a3. For example, the FET a4 has a drain terminal connected with the high-voltage battery 2 and has a source terminal connected with the FET a3. In the FET a4, a body diode d4 as a fourth diode is formed between the drain terminal and the source terminal.

The body diode d4 is provided to have a conduction direction opposite to the direction in which the regeneration current flows and is connected in parallel with the FET a4. Specifically, the body diode d4 is connected in parallel with the FET a4 while having a cathode terminal provided on the high-voltage battery 2 side and an anode terminal provided on the high-voltage load unit 3 side. In other words, the cathode terminal of the body diode d4 is connected with the drain terminal of the FET a4, and the anode terminal of the body diode d4 is connected with the source terminal of the FET a4. The FET a4 has a gate terminal connected with the drive circuit b4 to be described later and is driven by the drive circuit b4. The FET a4 is turned on or off upon being driven by the drive circuit b4 to allow or cut off conduction of the regeneration current flowing from the high-voltage load unit 3 to the high-voltage battery 2 downstream of the power circuit 101. The FET a4 has no function to cut off the power source current but allows conduction thereof. For example, when the FET a4 is off while the power source current flows, the power source current flows through the body diode d4. When the FET a4 is on while the power source current flows, the power source current does not flow through the body diode d4 but flows between the drain terminal and the source terminal.

The drive circuit b3 drives the FET a3. The drive circuit b3 is connected with the gate terminal of the FET a3 and drives the FET a3 based on ON and OFF commands from the controller 50 to be described later. When the ON command is output from the controller 50, the drive circuit b3 turns on the FET a3 by outputting a drive signal Sg (ON) to the FET a3. For example, the drive circuit b3 turns on the FET a3 by applying ON voltage to the gate terminal of the FET a3. When the OFF command is output from the controller 50, the drive circuit b3 turns off the FET a3 by outputting a drive signal Sg (OFF) to the FET a3. For example, the drive circuit b3 turns off the FET a3 by applying OFF voltage to the gate terminal of the FET a3. To prevent flow of excessive power source current (inrush current) through the power circuit 101 at a timing when the FET a3 is turned on, the drive circuit b3 adjusts the ON voltage applied to the gate terminal to keep the load current I at a certain value or smaller.

The drive circuit b4 drives the FET a4. The drive circuit b4 is connected with the gate terminal of the FET a4 and drives the FET a4 based on ON and OFF commands from the controller 50 to be described later. When the ON command is output from the controller 50, the drive circuit b4 turns on the FET a4 by outputting a drive signal Sg (ON) to the FET a4. For example, the drive circuit b4 turns on the FET a4 by applying ON voltage to the gate terminal of the FET a4. When the OFF command is output from the controller 50, the drive circuit b4 turns off the FET a4 by outputting a drive signal Sg (OFF) to the FET a4. For example, the drive circuit b4 turns off the FET a4 by applying OFF voltage to the gate terminal of the FET a4.

The detection circuit c3 detects voltage. The detection circuit c3 is connected in parallel with the body diode d3 and detects forward voltage Vf as voltage fall of the body diode d3. For example, the detection circuit c3 is connected with the anode and cathode terminals of the body diode d3 and detects the forward voltage Vf as voltage fall between the anode and cathode terminals. The detection circuit c3 is connected with the controller 50 and outputs the forward voltage Vf of the body diode d3 as a result of the detection to the controller 50.

The detection circuit c4 detects voltage. The detection circuit c4 is connected in parallel with the body diode d4 and detects forward voltage Vf as voltage fall of the body diode d4. For example, the detection circuit c4 is connected with the anode and cathode terminals of the body diode d4 and detects the forward voltage Vf as voltage fall between the anode and cathode terminals. The detection circuit c4 is connected with the controller 50 and outputs the forward voltage Vf of the body diode d4 as a result of the detection to the controller 50.

The controller 50 controls the upstream-side bidirectional cutoff circuit 30 and the downstream-side bidirectional cutoff circuit 40. The controller 50 includes an electronic circuit mainly achieved by a publicly known microcomputer including a CPU, a ROM and a RAM serving as storage units, and an interface. The controller 50 controls the drive circuits b1 and b2 of the upstream-side bidirectional cutoff circuit 30 and the drive circuits b3 and b4 of the downstream-side bidirectional cutoff circuit 40. For example, the controller 50 determines whether the FETs a1 to a4 are defective based on results of detection by the current sensor 10, the voltage monitoring circuit 20, and the detection circuits c1 to c4, and controls the drive circuits b1 to b4 based on a result of the determination. The controller 50 is connected with the current sensor 10 and determines, based on the load current I output from the current sensor 10, whether on-fixation defect has occurred in which the FETs a1 and a3 are each firmly fixed to the on state and not turned off or off-fixation defect has occurred in which the FETs a1 and a3 are each firmly fixed to the off state and not turned on. The controller 50 is connected with the voltage monitoring circuit 20 and determines, based on the load voltage V output from the voltage monitoring circuit 20, whether the on-fixation defect of the FETs a1 and a3 and the off-fixation defect of the FETs a1 and a3 have occurred. The controller 50 is connected with the detection circuit c1 and determines, based on the forward voltage Vf of the body diode d1 output from the detection circuit c1, whether the on-fixation defect and off-fixation defect of the FET a1 have occurred. The controller 50 is connected with the detection circuit c2 and determines, based on the forward voltage Vf of the body diode d2 output from the detection circuit c2, whether the on-fixation defect and off-fixation defect of the FET a2 have occurred. The controller 50 is connected with the detection circuit c3 and determines, based on the forward voltage Vf of the body diode d3 output from the detection circuit c3, whether the on-fixation defect and off-fixation defect of the FET a3 have occurred. The controller 50 is connected with the detection circuit c4 and determines, based on the forward voltage Vf of the body diode d4 output from the detection circuit c4, whether the on-fixation defect and off-fixation defect of the FET a4 have occurred.

Figure 2:
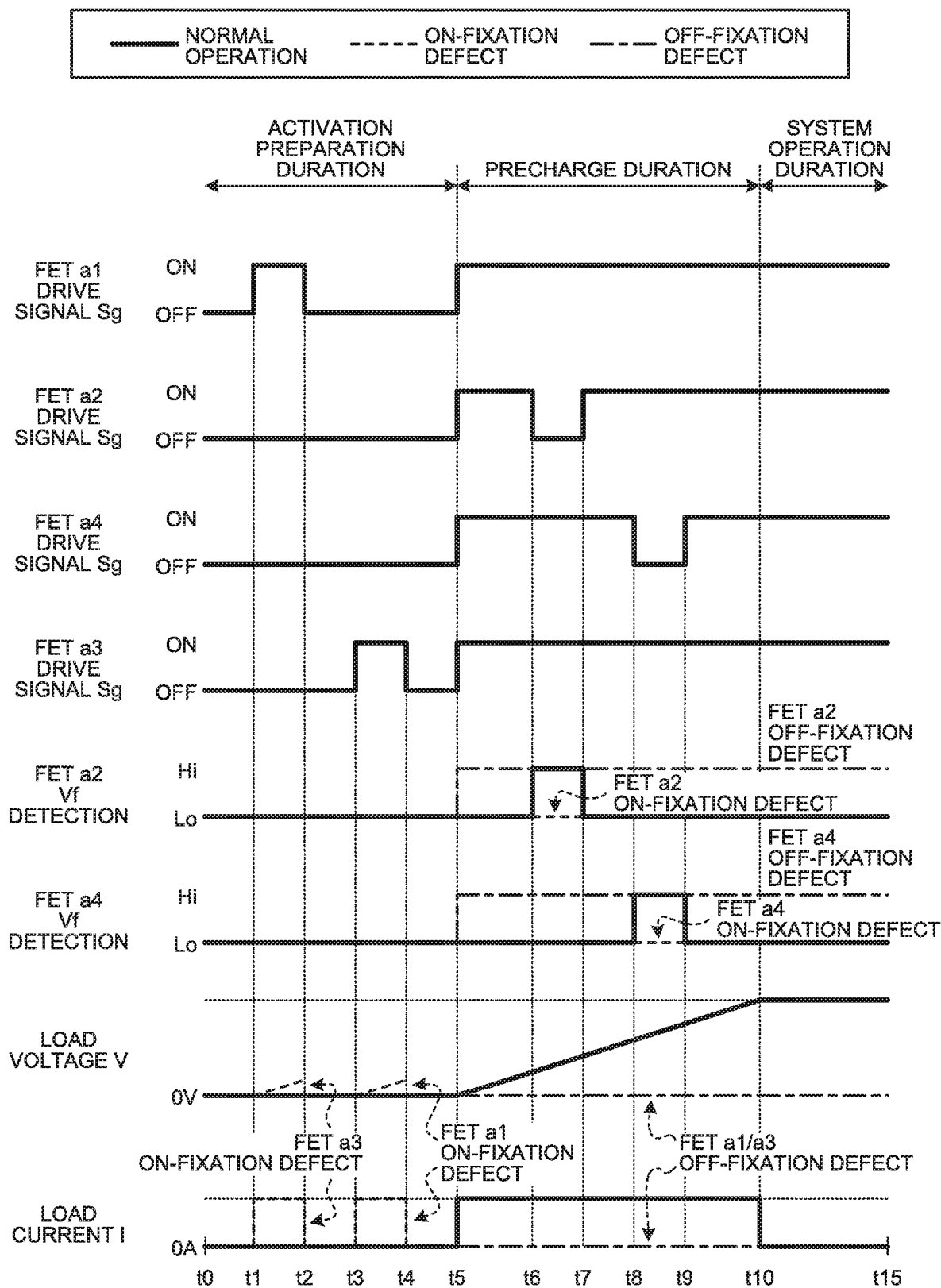
FIG. 2 is a sequence chart illustrating an exemplary operation of the power source switch control device according to the embodiment.
Figure 3:
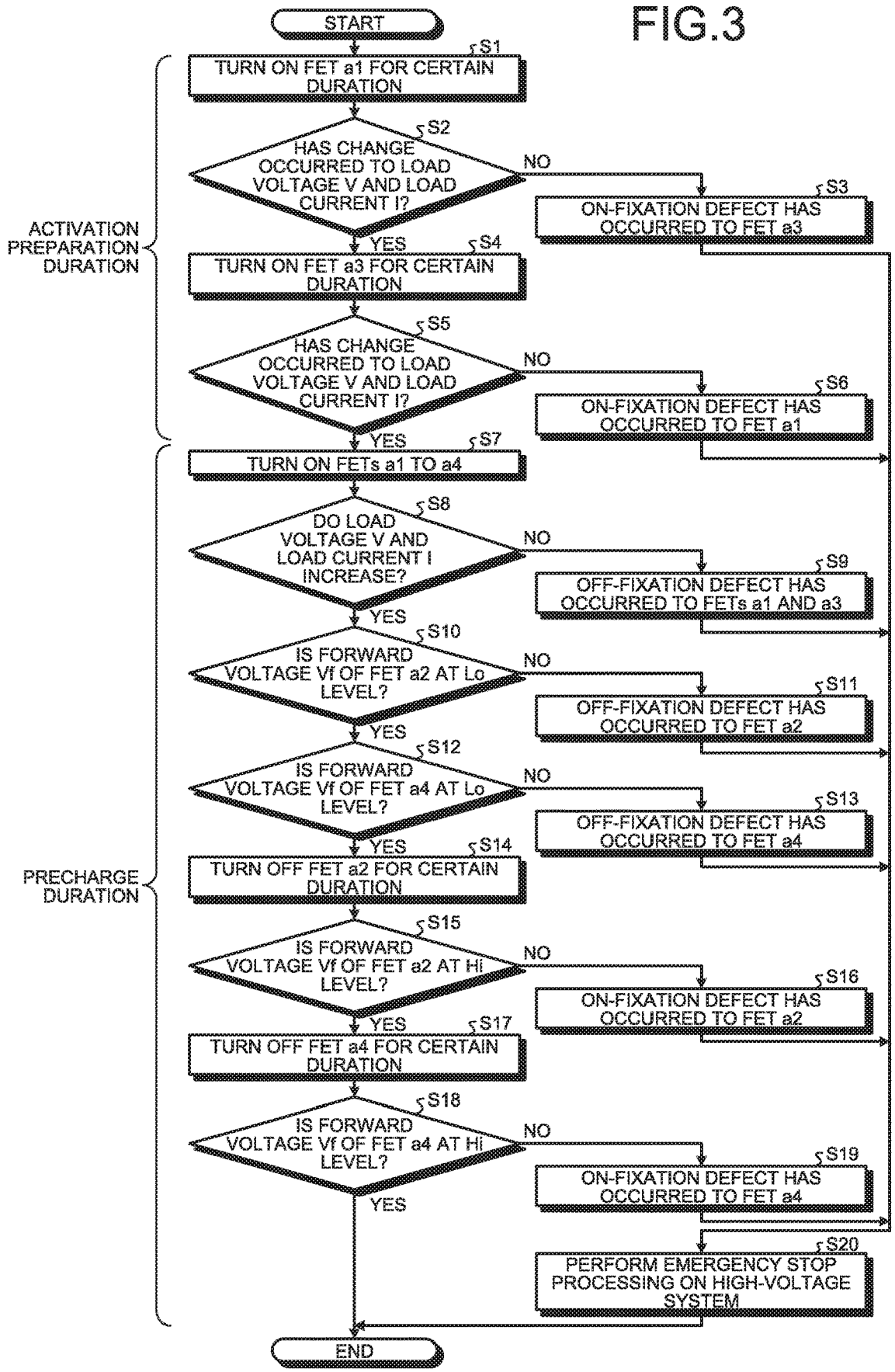
FIG. 3 is a flowchart illustrating the exemplary operation of the power source switch control device according to the embodiment.

The following describes exemplary operation of the power source switch control device 1 with reference to FIGS. 2 and 3. The power source switch control device 1 has the off state (time t0) in which the FETs a1 to a4 are all off before the high-voltage system 100 (power circuit 101) is activated and an activation preparation duration (time t0 to time t5) in which activation of the high-voltage system 100 is prepared from the off state. In addition, the power source switch control device 1 has a precharge duration (time t5 to time t10) in which inrush current flowing from the high-voltage battery 2 to the high-voltage load unit 3 is avoided when the high-voltage system 100 is activated after the activation preparation duration ends, a system operation duration (time t10 to time t15) in which the high-voltage system 100 normally operates after the precharge duration ends, and a system stop duration (time t22 to time t26) (refer to FIG. 8) in which the high-voltage system 100 normally operating is stopped.

The following describes exemplary operation of the power source switch control device 1 in the activation preparation duration (time t0 to time t5) and the precharge duration (time t5 to time t10) with reference to an example illustrated in FIGS. 2 and 3. In this example, it is assumed that the power source switch control device 1 is in positive conduction in which power source electricity is supplied from the high-voltage battery 2 to the high-voltage load unit 3. In the power source switch control device 1, the FETs a1 to a4 are all off in the above-described off state (time t0). The power source switch control device 1 turns on, through the controller 50, the FET a1 for a certain duration in the above-described activation preparation duration (step S1). For example, the controller 50 turns on the FET a1 and turns off the FETs a2 to a4 in the duration from time t1 to time t2 illustrated in FIG. 2. Subsequently, the controller 50 determines whether change has occurred to the load voltage V and the load current I (step S2). When change has occurred to the load voltage V and the load current I (No at step S2), the controller 50 determines that on-fixation defect has occurred in which the FET a3 is firmly fixed to the on state and not turned off although the FET a3 should be off because the power source current flows (step S3). When no change has occurred to the load voltage V and the load current I (Yes at step S2), the controller 50 turns off the FET a1 and turns on the FET a3 for a certain duration (step S4). For example, the controller 50 turns on the FET a3 and turns off the FETs a1, a2, and a4 in the duration from time t3 to time t4 illustrated in FIG. 2.

Subsequently, the controller 50 determines whether change has occurred to the load voltage V and the load current I (step S5). When change has occurred to the load voltage V and the load current I (No at step S5), the controller 50 determines that on-fixation defect has occurred in which the FET a1 is firmly fixed to the on state and not turned off although the FET a1 should be off because the power source current flows (step S6). When no change has occurred to the load voltage V and the load current I (Yes at step S5), the controller 50 turns on the FETs a1 to a4 at time t5 (step S7). In the high-voltage system 100, the activation preparation duration is ended at time t5, the precharge duration is started on time t5 and later. The controller 50 determines whether the load voltage V and the load current I increase in the precharge duration (step S8). When the load voltage V and the load current I do not increase in the precharge duration (No at step S8), the controller 50 determines that off-fixation defect has occurred in which at least one of the FETs a1 and a3 is firmly fixed to the off state and not turned on because no power source current flows (step S9). When the load voltage V and the load current I increase in the precharge duration (Yes at step S8), the controller 50 determines whether the forward voltage Vf of the body diode d2 of the FET a2 is at Lo level (low level) (step S10). When the forward voltage Vf of the body diode d2 of the FET a2 is at Hi level (high level) (No at step S10), the controller 50 determines that off-fixation defect has occurred in which the FET a2 is firmly fixed to the off state and not turned on although the FET a2 should be on (step S11). When the FET a2 is on, the forward voltage Vf of the body diode d2 is at Lo level because the power source current does not flow through the body diode d2 but flows between the drain terminal and the source terminal. When the FET a2 is off, the forward voltage Vf of the body diode d2 is at Hi level because the power source current does not flow between the drain terminal and the source terminal but flows through the body diode d2. When the forward voltage Vf of the body diode d2 of the FET a2 is at Lo level (Yes at step S10), the controller 50 determines whether the forward voltage Vf of the body diode d4 of the FET a4 is at Lo level (step S12). When the forward voltage Vf of the body diode d4 of the FET a4 is at Hi level (No at step S12), the controller 50 determines that off-fixation defect has occurred in which the FET a4 is firmly fixed to the off state and not turned on although the FET a4 should be on (step S13). When the forward voltage Vf of the body diode d4 of the FET a4 is at Lo level (Yes at step S12), the controller 50 turns off the FET a2 for a certain duration (step S14). For example, the controller 50 turns off the FET a2 and turns on the FETs a1, a3, and a4 in the duration from time t6 to time t7 illustrated in FIG. 2.

Subsequently, the controller 50 determines whether the forward voltage Vf of the body diode d2 of the FET a2 is at Hi level (step S15). When the forward voltage Vf of the body diode d2 of the FET a2 is at Lo level (No at step S15), the controller 50 determines that on-fixation detect has occurred in which the FET a2 is firmly fixed to the on state and not turned off although the FET a2 should be off (step S16). When the forward voltage Vf of the body diode d2 of the FET a2 is at Hi level (Yes at step S15), the controller 50 turns off the FET a4 for a certain duration (step S17). For example, the controller 50 turns off the FET a4 and turns on the FETs a1, a2, and a3 in the duration from time t8 to time t9 illustrated in FIG. 2. Subsequently, the controller 50 determines whether the forward voltage Vf of the body diode d4 of the FET a4 is at Hi level (step S18). When the forward voltage Vf of the body diode d4 of the FET a4 is at Lo level (No at step S18) the controller 50 determines that on-fixation defect has occurred in which the FET a4 is firmly fixed to the on state and not turned off although the FET a4 should be off (step S19). When the forward voltage Vf of the body diode d4 of the FET a4 is at Hi level (Yes at step S18), the controller 50 determines that the FETs a1 to a4 are normal and ends the defect determination processing on the FETs a1 to a4. When having determined that the on-fixation defect or the off-fixation defect has occurred in any of the FETs a1 to a4, the controller 50 performs emergency stop processing on the high-voltage system 100 (step S20) and ends the defect determination processing. For example, the controller 50 cuts off the power circuit 101 by turning off all FETs a1 to a4 and appropriately discharges electric charge accumulated in the capacitor of the high-voltage load unit 3. In addition, the controller 50 outputs which of the FETs a1 to a4 is defective and the state (the on-fixation defect or the off-fixation defect) thereof to a higher-level electronic controller (ECU) (not illustrated).

Figure 4:
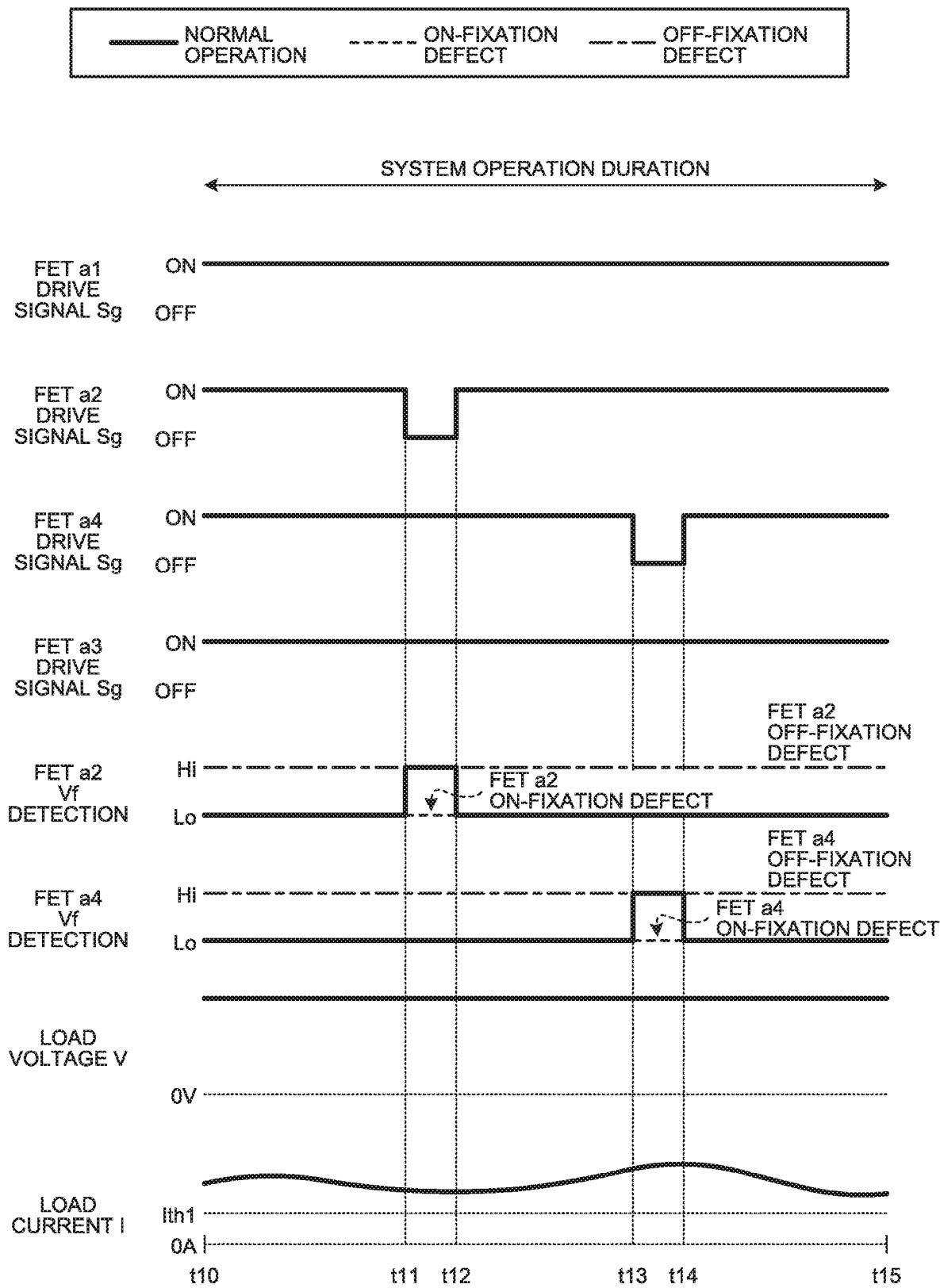
FIG. 4 is a sequence chart illustrating an exemplary operation of the power source switch control device according to the embodiment.
Figure 5:
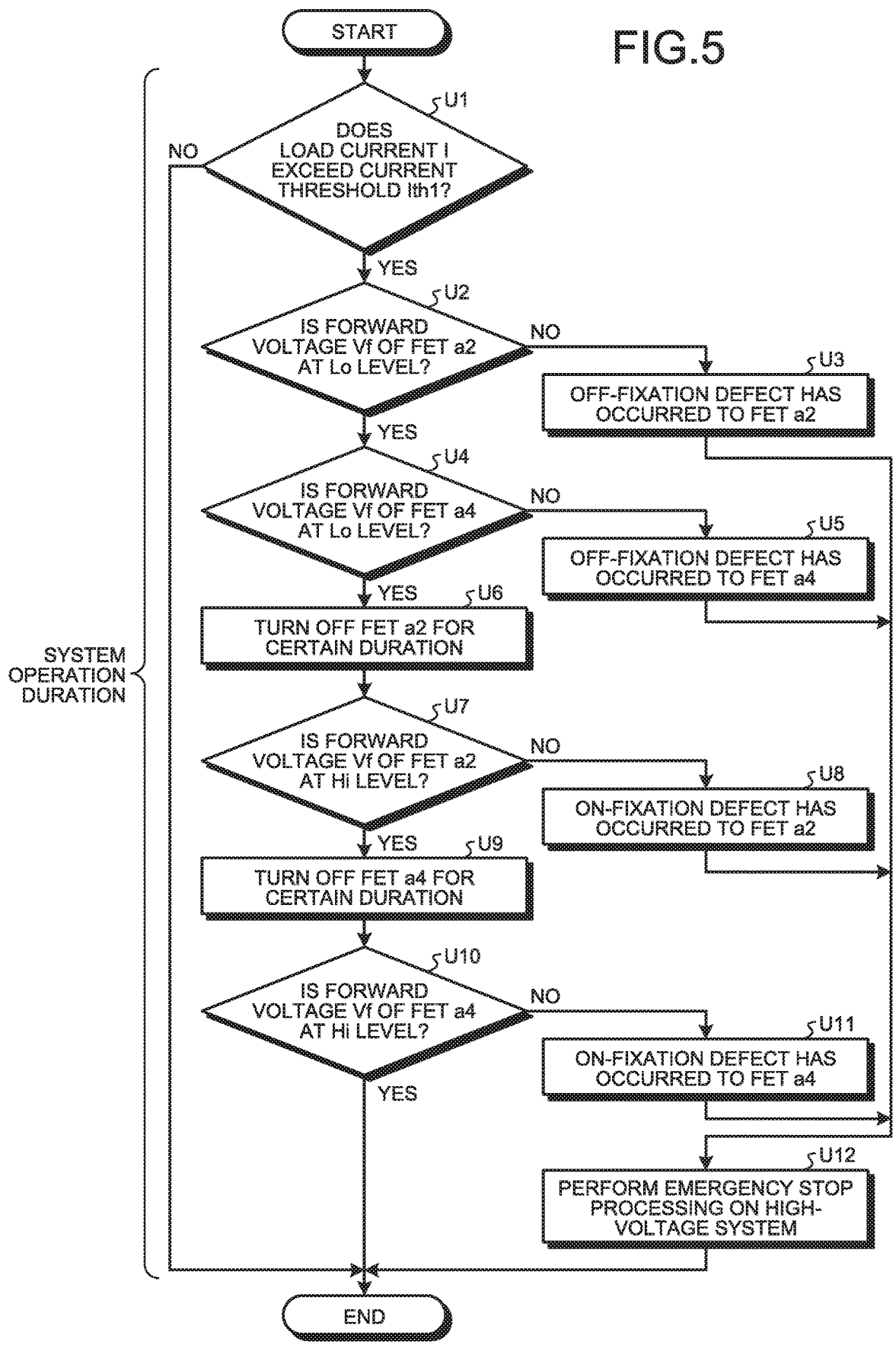
FIG. 5 is a flowchart illustrating the <exemplary operation of the power source switch control device according to the embodiment.

The following describes exemplary operation of the power source switch control device 1 with reference to FIGS. 4 and 5. The exemplary operation of the power source switch control device 1 in the system operation duration (time t10 to time t5) will be described below with reference to an example illustrated in FIGS. 4 and 5. In this example, it is assumed that the power source switch control device 1 is in positive conduction in which power source electricity is supplied from the high-voltage battery 2 to the high-voltage load unit 3. In the power source switch control device 1, the FETs a1 to a4 are all on at time t10 in the system operation duration. The power source switch control device 1 determines, through the controller 50, whether the load current I exceeds a current threshold Ith1 in the system operation duration (step U1). The current threshold Ith1 is a current value with which the forward voltage Vf of the body diodes d2 and d4 of the FETs a2 and a4 can be detected. When the load current I does not exceed the current threshold Ith1 in the system operation duration (No at step U1), the controller 50 determines that defect determination is impossible and ends the defect determination processing. When having determined that the load current I exceeds the current threshold Ith1 in the system operation duration (Yes at step U1), the controller 50 determines whether the forward voltage Vf of the body diode d2 of the FET a2 is at Lo level (step U2). When the forward voltage Vf of the body diode d2 of the FET a2 is at Hi level (No at step U2), the controller 50 determines that off-fixation defect has occurred in which the FET a2 is firmly fixed to the off state and not turned on although the FET a2 should be on (step U3). When the forward voltage Vf of the body diode d2 of the FET a2 is at Lo level (Yes at step U2), the controller 50 determines whether the forward voltage Vf of the body diode d4 of the FET a4 is at Lo level (step U4). When the forward voltage Vf of the body diode d4 of the FET a4 is at Hi level (No at step U4), the controller 50 determines that off-fixation defect has occurred in which the FET a4 is firmly fixed to the off state and not turned on although the FET a4 should be on (step U5). When the forward voltage Vf of the body diode d4 of the FET a4 is at Lo level (Yes at step U4), the controller 50 turns off the FET a2 for a certain duration (step U6). For example, the controller 50 turns off the FET a2 and turns on the FETs a1, a3, and a4 in the duration from time t11 to time t12 illustrated in FIG. 4.

Subsequently, the controller 50 determines whether the forward voltage Vf of the body diode d2 of the FET a2 is at Hi level (step U7). When the forward voltage Vf of the body diode d2 of the FET a2 is at Lo level (No at step U7), the controller 50 determines that on-fixation defect has occurred in which the FET a2 is firmly fixed to the on state and not turned off although the FET a2 should be off (step U8). When the forward voltage Vf of the body diode d2 of the FET a2 is at Hi level (Yes at step U7), the controller 50 turns off the FET a4 for a certain duration (step U9). For example, the controller 50 turns off the FET a4 and turns on the FETs a1, a2, and a3 in the duration from time t13 to time t14 illustrated in FIG. 4. Subsequently, the controller 50 determines whether the forward voltage Vf of the body diode d4 of the FET a4 is at Hi level (step U10). When the forward voltage Vf of the body diode d4 of the FET a4 is at Lo level (No at step U10), the controller 50 determines that on-fixation defect has occurred in which the FET a4 is firmly fixed to the on state and not turned off although the FET a4 should be off (step U11). When the forward voltage Vf of the body diode d4 of the FET a4 is at Hi level (Yes at step U10), the controller 50 determines that the FETs a2 and a4 are normal and ends the defect determination processing on the FETs a2 and a4. When having determined the on-fixation defect or the off-fixation defect has occurred in any of the FETs a2 and a4, the controller 50 performs emergency stop processing on the high-voltage system 100 (step U12) and ends the defect determination processing. For example/the controller 50 cuts off the power circuit 101 by turning off all FETs a1 to a4 and appropriately discharges electric charge accumulated in the capacitor of the high-voltage load unit 3. In addition, the controller 50 outputs which of the FETs a2 and a4 is defective and the state (the on-fixation defect or the off-fixation defect) thereof to a higher-level ECU.

Figure 6:
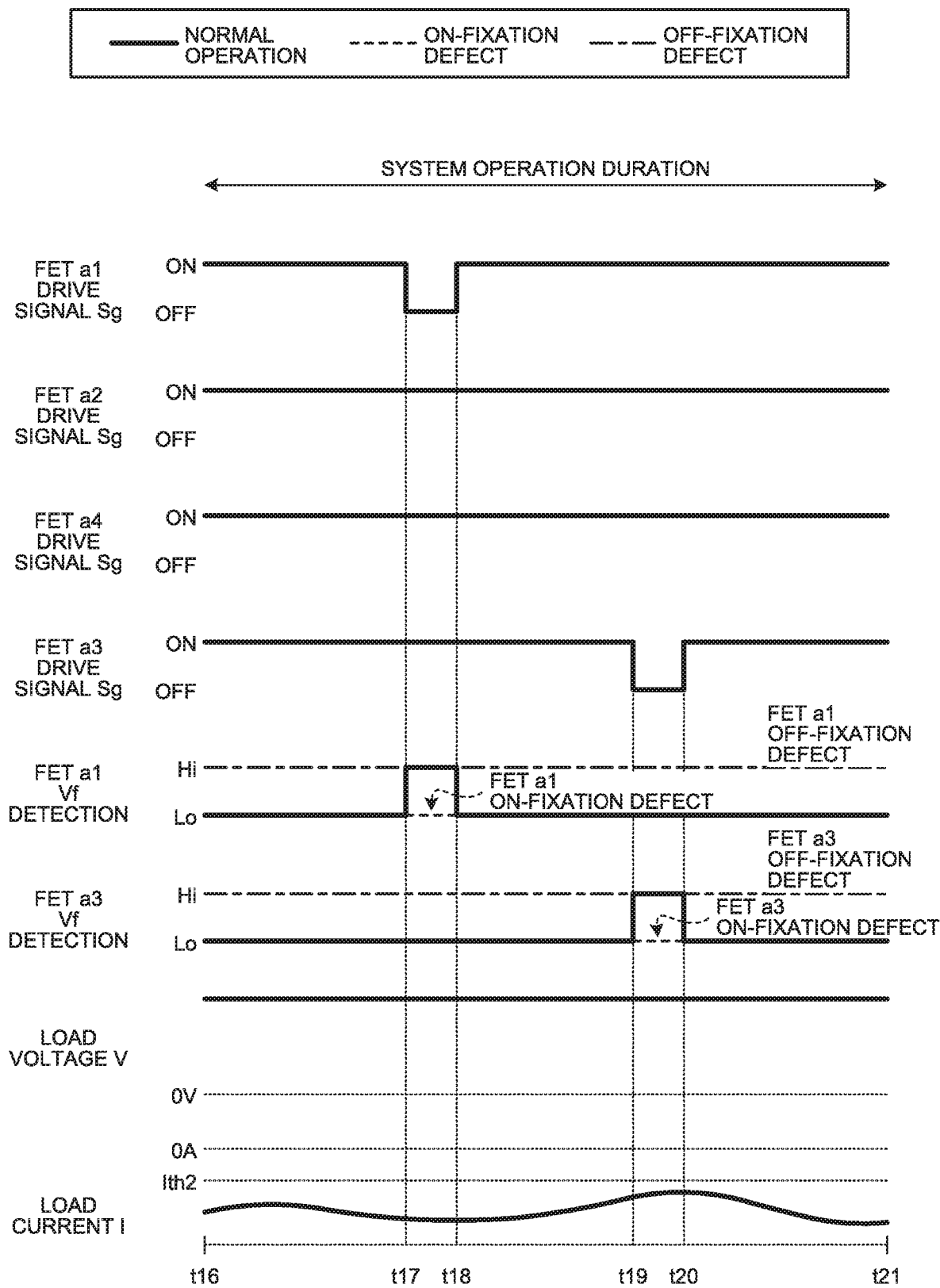
FIG. 6 is a sequence chart illustrating an exemplary operation of the power source switch control device according to the embodiment.
Figure 7:
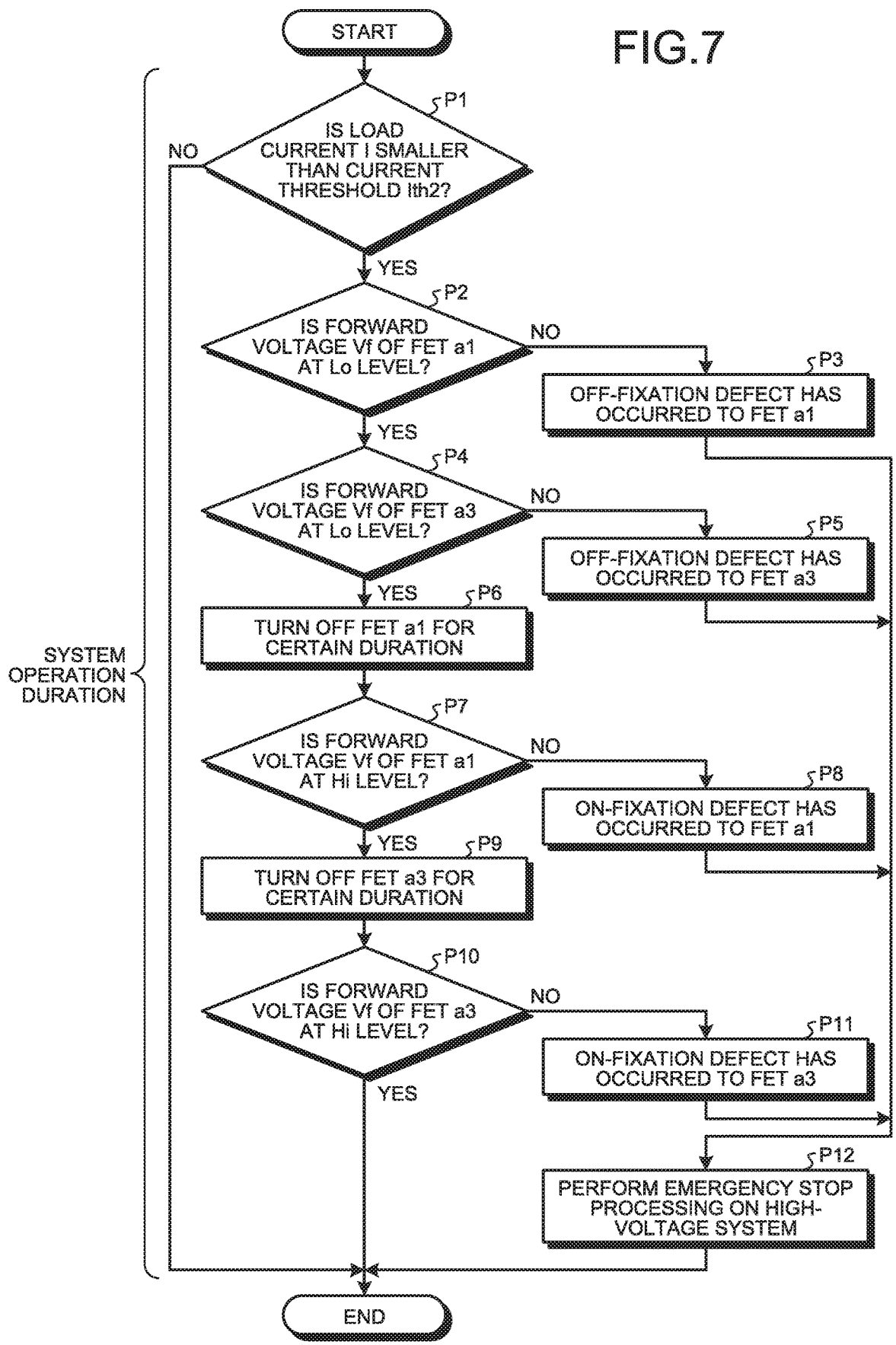
FIG. 7 is a flowchart illustrating the exemplary operation of the power source switch control device according to the embodiment.

The following describes exemplary operation of the power source switch control device 1 with reference to FIGS. 6 and 7. The exemplary operation of the power source switch control device 1 in the system operation duration (time t10 to time t21) will be described below with reference to an example illustrated in FIGS. 6 and 7. In this example, it is assumed that the power source switch control device 1 is in negative conduction in which regenerative electricity is supplied from the high-voltage load unit 3 to the high-voltage battery 2. In the power source switch control device 1, the FETs a1 to a4 are all on at time t16 in the system operation duration. The power source switch control device 1 determines, through the controller 50, whether the load current I is smaller than a current threshold Ith2 in the system operation duration (step P1). The current threshold Ith2 is a current value with which the forward voltage Vf of the body diodes d1 and d3 of the FETs a1 and a3 can be detected. When the load current I is not smaller than the current threshold Ith2 in the system operation duration (No at step P1), the controller 50 determines that defect determination is impossible and ends the defect determination processing. When having determined that the load current I is smaller than the current threshold Ith2 in the system operation duration (Yes at step P1), the controller 50 determines whether the forward voltage Vf of the body diode d1 of the FET a1 is at Lo level (step P2). When the forward voltage Vf of the body diode d1 of the FET a1 is at Hi level (No at step P2), the controller 50 determines that off-fixation defect has occurred in which the FET a1 is firmly fixed to the off state and not turned on although the FET a1 should be on (step P3). When the forward voltage Vf of the body diode d1 of the FET a1 is at Lo level (Yes at step P2), the controller 50 determines whether the forward voltage Vf of the body diode d3 of the FET a3 is at Lo level (step P4). When the forward voltage Vf of the body diode d3 of the FET a3 is at Hi level (No at step P4), the controller 50 determines that off-fixation defect has occurred in which the FET a3 is firmly fixed to the off state and not turned on although the FET a3 should be on (step P5). When the forward voltage Vf of the body diode d3 of the FET a3 is at Lo level (Yes at step P4), the controller 50 turns off the FET a1 for a certain duration (step P6). For example, the controller 50 turns off the FET a1 and turns on the FETs a2, a3, and a4 in the duration from time t17 to time t8 illustrated in FIG. 6.

Subsequently, the controller 50 determines whether the forward voltage Vf of the body diode d1 of the FET a1 is at Hi level (step P7). When the forward voltage Vf of the body diode d1 of the FET a1 is at Lo level (No at step P7), the controller 50 determines that on-fixation defect has occurred in which the FET a1 is firmly fixed to the on state and not turned off although the FET a1 should be off (step P8). When the forward voltage Vf of the body diode d1 of the FET a1 is at Hi level (Yes at step P7), the controller 50 turns off the FET a3 for a certain duration (step P9). For example, the controller 50 turns off the FET a3 and turns on the FETs a1, a2, and a4 in the duration from time t19 to time t20 illustrated in FIG. 6.

Subsequently, the controller 50 determines whether the forward voltage Vf of the body diode d3 of the FET a3 is at Hi level (step P10). When the forward voltage Vf of the body diode d3 of the FET a3 is at Lo level (No at step P10), the controller 50 determines that on-fixation defect has occurred in which the FET a3 is firmly fixed to the on state and not turned off although the FET a3 should be off (step P11). When the forward voltage Vf of the body diode d3 of the FET a3 is at Hi level (Yes at step P10), the controller 50 determines that the FETs a1 and a3 are normal and ends the defect determination processing on the FETs a1 and a3. When having determined the on-fixation defect or the off-fixation defect has occurred in any of the FETs a1 and a3, the controller 50 performs emergency stop processing on the high-voltage system 100 (step P12) and ends the defect determination processing. For example, the controller 50 cuts off the power circuit 101 by turning off all FETs a1 to a4 and appropriately discharges electric charge accumulated in the capacitor of the high-voltage load unit 3. In addition, the controller 50 outputs which of the FETs a1 and a3 is defective and the state (the on-fixation defect or the off-fixation defect) thereof to a higher-level ECU.

The following describes exemplary operation of the power source switch control device 1 with reference to FIGS. 8 and 9. The exemplary operation of the power source switch control device 1 in the system stop duration (time t22 to time t26) will be described below with reference to an example illustrated in FIGS. 8 and 9. In this example, it is assumed that the power source switch control device 1 is in positive conduction in which power source electricity is supplied from the high-voltage battery 2 to the high-voltage load unit 3. In the power source switch control device 1, the FETs a1 to a4 are all on in the system operation duration before the high-voltage system 100 is stopped. The power source switch control device 1 turns off, through the controller 50, the FET a1 for a certain duration in the system stop duration (step Q1). For example, the controller 50 turns off the FET a1 and turns on the FETs a2 to a4 in the duration from time t22 to time t23 illustrated in FIG. 8. Subsequently, the controller 50 determines whether the load voltage V decreases in the duration from time t22 to time t23 (step Q2). When the load voltage V does not decrease (No at step Q2), the controller 50 determines that on-fixation defect has occurred in which the FET a1 is firmly fixed to the on state and not turned off although the FET a1 should be off (step Q3). When the load voltage V decreases (Yes at step Q2), the controller 50 turns off the FET a3 for a certain duration (step Q4). For example, the controller 50 turns off the FET a3 and turns on the FETs a1, a2, and a4 in the duration from time t24 to time t25 illustrated in FIG. 8.

Subsequently, the controller 50 determines whether the load voltage V decreases in the duration from time t24 to time t25 (step Q5). When the load voltage V does not decrease (No at step Q5), the controller 50 determines that on-fixation defect has occurred in which the FET a3 is firmly fixed to the on state and not turned off although the FET a3 should be off (step Q6). When the load voltage V decreases (Yes at step Q5), the controller 50 turns off the FETs a1, a2, and a4 (step Q7) and ends the defect determination processing on the FETs a1 and a3. When having determined that the on-fixation defect has occurred in any of the FETs a1 and a3, the controller 50 performs emergency stop processing on the high-voltage system 100 (step Q8) and ends the defect determination processing. For example, the controller 50 cuts off the power circuit 101 by turning off all FETs a1 to a4 and appropriately discharges electric charge accumulated in the capacitor of the high-voltage load unit 3. In addition, the controller 50 outputs which of the FETs a1 and a3 is defective and the state (the on-fixation defect) thereof to a higher-level ECU.

As described above, the power source switch control device 1 according to the embodiment includes the upstream-side bidirectional cutoff circuit 30, the downstream-side bidirectional cutoff circuit 40, and the controller 50. The upstream-side bidirectional cutoff circuit 30 is provided between the positive electrode of the high-voltage battery 2 and the high-voltage load unit 3 in the power circuit 101 in which the high-voltage battery 2 and the high-voltage load unit 3 are connected with each other and allows or cuts off conduction of the power source current flowing from the high-voltage battery 2 to the high-voltage load unit 3 and the regeneration current flowing from the high-voltage load unit 3 to the high-voltage battery 2. The downstream-side bidirectional cutoff circuit 40 is provided between the negative electrode of the high-voltage battery 2 and the high-voltage load unit 3 and allows or cuts off conduction of the power source current and the regeneration current. The controller 50 controls the upstream-side bidirectional cutoff circuit 30 and the downstream-side bidirectional cutoff circuit 40. The upstream-side bidirectional cutoff circuit 30 includes the FET a1, the FET a2, the body diode d1, the body diode d2, the detection circuit c1, and the detection circuit c2. The FET a1 allows or cuts off conduction of the power source current. The FET a2 is connected in series with the FET a1 and allows or cuts off conduction of the regeneration current. The body diode d1 is provided to have a conduction direction opposite to the direction in which the power source current flows and is connected in parallel with the FET a1. The body diode d2 is provided to have a conduction direction opposite to the direction in which the regeneration current flows and is connected in parallel with the FET a2. The detection circuit c1 is connected in parallel with the body diode d1 and detects the forward voltage Vf of the body diode d1. The detection circuit c2 is connected in parallel with the body diode d2 and detects the forward voltage Vf of the body diode d2. The downstream-side bidirectional cutoff circuit 40 includes the FET a3, the FET a4, the body diode d3, the body diode d4, the detection circuit c3, and the detection circuit c4. The FET a3 allows or cuts off conduction of the power source current. The FET a4 is connected in series with the FET a3 and allows or cuts off conduction of the regeneration current. The body diode d3 is provided to have a conduction direction opposite to the direction in which the power source current flows and is connected in parallel with the FET a3. The body diode d4 is provided to have a conduction direction opposite to the direction in which the regeneration current flows and is connected in parallel with the FET a4. The detection circuit c3 is connected in parallel with the body diode d3 and detects the forward voltage Vf of the body diode d3. The detection circuit c4 is connected in parallel with the body diode d4 and detects the forward voltage Vf of the body diode d4. The controller 50 determines whether a defect has occurred in the power circuit 101 based on results of the detection by the detection circuit c1, the detection circuit c2, the detection circuit c3, and the detection circuit c4.

With this configuration, the power source switch control device 1 can determine whether the FET a1 is defective based on the result of the detection by the detection circuit c1, and can determine whether the FET a2 is defective based on the result of the detection by the detection circuit c2. In addition, the power source switch control device 1 can determine whether the FET a3 is defective based on the result of the detection by the detection circuit c3, and can determine whether the FET a4 is defective based on the result of the detection by the detection circuit c4. In this manner, the power source switch control device 1 can individually determine whether the FETs a1 to a4 are defective based on the results of the detection by the detection circuits c1 to c4. Through the determination, the power source switch control device 1 can specify which of the FETs a1 to a4 is defective. Through the specification, the power source switch control device 1 can appropriately detect defect in the FETs a1 to a4. In addition, the power source switch control device 1 can specify a place where the defect has occurred and thus can achieve early and reliable recovery of the defect.

In the above-described power source switch control device 1, the controller 50 has the activation preparation duration in which activation of the power circuit 101 is prepared from the off state of the power circuit 101 with the FETs a1 to a4 all turned off, and the precharge duration in which inrush current flowing from the high-voltage battery 2 to the high-voltage load unit 3 is avoided after the activation preparation duration ends. In addition, the controller 50 has the system operation duration in which the power circuit 101 normally operates after the precharge duration ends, and the system stop duration in which the power circuit 101 normally operating is stopped. The controller 50 determines whether a defect has occurred in the power circuit 101 in at least one of these four durations. With this configuration, the power source switch control device 1 can determine, in a short time without affecting operation of the high-voltage system 100/whether a defect, has occurred in the FETs a1 to a4.

In the above-described power source switch control device 1, the controller 50 turns on the FET a1, the FET a2, the FET a3, and the FET a4 and causes the power source current to flow through the power circuit 101. The controller 50 determines that off-fixation defect has occurred in which the FET a2 is firmly fixed to the off state and not turned on, upon detection of the forward voltage Vf of the body diode a2 by the detection circuit c2 while the power source current flows through the power circuit 101. In addition, the controller 50 determines that off-fixation defect has occurred in which the FET a4 is firmly fixed to the off state and not turned on, upon detection of the forward voltage Vf of the body diode d4 by the detection circuit c4. Kith this configuration, the power source switch control device 1 can determine the kind of defect such as off-fixation defect in which the FETs a2 and a4 are each firmly fixed to the off state and not turned on at supply of the power source current.

In the above-described power source switch control device 1, the controller 50 turns on the FETs a1 and a3 and turns off the FETs a2 and a4 and causes the power source current to flow through the power circuit 101. The controller 50 determines that on-fixation defect has occurred in which the FET a2 is firmly fixed to the on state and not turned off, upon no detection of the forward voltage Vf of the body diode d2 by the detection circuit c2 while the power source current flows through the power circuit 101. In addition, the controller 50 determines that on-fixation defect has occurred in which the FET a4 is firmly fixed to the on state and not turned off, upon no detection of the forward voltage Vf of the body diode d4 by the detection circuit c4. The power source switch control device 1 can determine the find of defect such as on-fixation defect in which the FETs a2 and a4 are each firmly fixed to the on state and not turned off at supply of the power source current.

In the above-described power source switch control device 1, the controller 50 turns on the FET a1, the FET a2, the FET a3, and the FET a4 and causes the regeneration current to flow through the power circuit 101. The controller 50 determines that off-fixation defect has occurred in which the FET a1 is firmly fixed to the off state and not turned on, upon detection of the forward voltage Vf of the body diode d1 by the detection circuit c1 while the regeneration current flows through the power circuit 101. In addition, the controller 50 determines that off-fixation defect has occurred in which the FET a3 is firmly fixed to the off state and not turned on, upon detection of the forward voltage Vf of the body diode d3 by the detection circuit c3. Kith this configuration, the power source switch control device 1 can determine the kind of defect such as off-fixation defect in which the FETs a1 and a3 are each firmly fixed to the off state and not turned on at supply of the regeneration current.

In the above-described power source switch control device 1, the controller 50 turns on the FETs a2 and a4 and turns off the FETs a1 and a3 and causes the regeneration current to flow through the power circuit 101. The controller 50 determines that on-fixation defect has occurred in which the FET a1 is firmly fixed to the on state and not turned off, upon no detection of the forward voltage Vf of the body diode d1 by the detection circuit c1 while the regeneration current flows through the power circuit 101. In addition, the controller 50 determines that on-fixation defect has occurred in which the FET a3 is firmly fixed to the on state and not turned off, upon no detection of the forward voltage Vf of the body diode d3 by the detection circuit c3. The power source switch control device 1 can determine the find of defect such as on-fixation defect in which the FETs a1 and a3 are each firmly fixed to the on state and not turned off at supply of the regeneration current.

Modifications

The following describes modifications of the embodiment. The FETs a1 to a4 are N-channel MOSFETs in the above-described examples but are not limited thereto and may be any other switching elements. For example, each switching element may be a P-channel MOSFET, a bipolar transistor, or an IGBT. When the switching element is the bipolar transistor or the IGBT, no parasitic capacitance occurs to the diode, and thus another diode needs to be connected in parallel.

In the above-described example, the power source switch control device 1 is applied to the high-voltage system 100 mounted on a vehicle, but may be mounted on the high-voltage system 100 mounted on a conveyance, a building a machine, or the like other than the vehicle.

In the above-described example, the power source switch control device 1 is applied to the high-voltage system 100, but may be applied to a low-voltage system.

A power source switch control device according to the present embodiment can individually determine whether first to fourth switching elements are defective and can appropriately detect defect of each switching element of a power source.

Although the invention has been described with respect to specific embodiments for a complete and clear disclosure the appended claims are not to be thus limited but are to be construed as embodying all modifications and alternative constructions that may occur to one skilled in the art that fairly fall within the basic teaching herein set forth.

What is claimed is:

1. A power source switch control device comprising:
   an upstream-side bidirectional cutoff circuit provided between a positive electrode of a direct-current power source and a load unit in a power circuit in which the direct-current power source and the load unit are connected with each other and configured to allow or cut off conduction of power source current flowing from the direct-current power source to the load unit and regeneration current flowing from the load unit to the direct-current power source;
   a downstream-side bidirectional cutoff circuit provided between a negative electrode of the direct-current power source and the load unit and configured to allow or cut off conduction of the power source current and the regeneration current; and
   a controller configured to control the upstream-side bidirectional cutoff circuit and the downstream-side bidirectional cutoff circuit, wherein the upstream-side bidirectional cutoff circuit includes:
a first switching element configured to allow or cut off conduction of the power source current;
a second switching element connected in series with the first switching element and configured to allow or cut off conduction of the regeneration current;
a first diode provided to have a conduction direction opposite to a direction in which the power source current flows and connected in parallel with the first switching element;
a second diode provided to have a conduction direction opposite to a direction in which the regeneration current flows and connected in parallel with the second switching element;
a first detection unit connected in parallel with the first diode and configured to detect forward voltage of the first diode; and
a second detection unit connected in parallel with the second diode and configured to detect forward voltage of the second diode,
the downstream-side bidirectional cutoff circuit includes:
a third switching element configured to allow or cut off conduction of the power source current;
a fourth switching element connected in series with the third switching element and configured to allow or cut off conduction of the regeneration current;
a third diode provided to have a conduction direction opposite to the direction in which the power source current flows and connected in parallel with the third switching element;
a fourth diode provided to have a conduction direction opposite to the direction in which the regeneration current flows and connected in parallel with the fourth switching element;
a third detection unit connected in parallel with the third diode and configured to detect forward voltage of the third diode; and
a fourth detection unit connected in parallel with the fourth diode and configured to detect forward voltage of the fourth diode, and
wherein the power source switch control device operates in four durations, which includes:
an activation preparation duration in which activation of the power circuit is prepared from an off state of the power circuit with the first to the fourth switching elements all off,
a precharge duration in which inrush current flowing from the direct-current power source to the load unit is avoided after the activation preparation duration ends,
a system operation duration in which the power circuit normally operates after the precharge duration ends, and
a system stop duration in which the power circuit normally operating is stopped, and
wherein, based on a determination that the power source switch control device is operating in the precharge duration or the system operation duration, the controller determines whether a defect has occurred in the power circuit based on at least one of results of the detection by the first detection unit, the second detection unit, the third detection unit, and the fourth detection unit and based on a determination that the power source switch control device is operating in the activation preparation duration or the system stop duration, the controller determines whether a defect has occurred in the power circuit based on a fifth detection unit different from the first detection unit, the second detection unit, the third detection unit, and the fourth detection unit.

2. The power source switch control device according to claim 1, wherein,
when turning on the first switching element, the second switching element, the third switching element, and the fourth switching element and causing the power source current to flow through the power circuit in the case of the precharge duration and the system operation duration,
the controller determines that off-fixation defect has occurred in which the second switching element is firmly fixed to an off state and not turned on, upon detection of the forward voltage of the second diode by the second detection unit, or determines that off-fixation defect has occurred in which the fourth switching element is firmly fixed to an off state and not turned on, upon detection of the forward voltage of the fourth diode by the fourth detection unit.

3. The power source switch control device according to claim 1, wherein,
when turning on the first switching element and the third switching element and turning off the second switching element and the fourth switching element and causing the power source current to flow through the power circuit in the case of the precharge duration and the system operation duration,
the controller determines that on-fixation defect has occurred in which the second switching element is firmly fixed to an on state and not turned off, upon no detection of the forward voltage of the second diode by the second detection unit, or determines that on-fixation defect has occurred in which the fourth switching element is firmly fixed to an on state and not turned off, upon no detection of the forward voltage of the fourth diode by the fourth detection unit.

4. The power source switch control device according to claim 2, wherein,
when turning on the first switching element and the third switching element and turning off the second switching element and the fourth switching element and causing the power source current to flow through the power circuit in the case of the precharge duration and the system operation duration,
the controller determines that on-fixation defect has occurred in which the second switching element is firmly fixed to an on state and not turned off, upon no detection of the forward voltage of the second diode by the second detection unit, or determines that on-fixation defect has occurred in which the fourth switching element is firmly fixed to an on state and not turned off, upon no detection of the forward voltage of the fourth diode by the fourth detection unit.

5. The power source switch control device according to claim 2, wherein,
when turning on the first switching element, the second switching element, the third switching element, and the fourth switching element and causing the regeneration current to flow through the power circuit in the case of the system operation duration,
the controller determines that off-fixation defect has occurred in which the first switching element is firmly fixed to an off state and not turned on, upon detection of the forward voltage of the first diode by the first detection unit, or determines that off-fixation defect has occurred in which the third switching element is firmly fixed to an off state and not turned on, upon detection of the forward voltage of the third diode by the third detection unit.

6. The power source switch control device according to claim 3, wherein,
when turning on the first switching element, the second switching element, the third switching element, and the fourth switching element and causing the regeneration current to flow through the power circuit in the case of the system operation duration,
the controller determines that off-fixation defect has occurred in which the first switching element is firmly fixed to an off state and not turned on, upon detection of the forward voltage of the first diode by the first detection unit, or determines that off-fixation defect has occurred in which the third switching element is firmly fixed to an off state and not turned on, upon detection of the forward voltage of the third diode by the third detection unit.

7. The power source switch control device according to claim 1, wherein,
when turning on the first switching element, the second switching element, the third switching element, and the fourth switching element and causing the regeneration current to flow through the power circuit in the case of the system operation duration,
the controller determines that off-fixation defect has occurred in which the first switching element is firmly fixed to an off state and not turned on, upon detection of the forward voltage of the first diode by the first detection unit, or determines that off-fixation defect has occurred in which the third switching element is firmly fixed to an off state and not turned on, upon detection of the forward voltage of the third diode by the third detection unit.

8. The power source switch control device according to claim 1, wherein,
when turning on the second switching element and the fourth switching element and turning off the first switching element and the third switching element and causing the regeneration current to flow through the power circuit in the case of the system operation duration,
the controller determines that on-fixation defect has occurred in which the first switching element is firmly fixed to an on state and not turned off, upon no detection of the forward voltage of the first diode by the first detection unit, or determines that on-fixation defect has occurred in which the third switching element is firmly fixed to an on state and not turned off, upon no detection of the forward voltage of the third diode by the third detection unit.

9. The power source switch control device according to claim 1, further comprising:
a current sensor configured to detect the power source current flowing through the power circuit, wherein
when turning on the first switching element, the second switching element, the third switching element, and the fourth switching element and causing the power source current to flow through the power circuit in the case of the precharge duration,
the controller determines that off-fixation defect has occurred in which at least one of the first switching element or the third switching element is firmly fixed to an off state and not turned on, upon no detection of the power source current by the current sensor.

10. The power source switch control device according to claim 1, further comprising:
a current sensor configured to detect the power source current flowing through the power circuit, wherein
when turning on the first switching element and turning off the second switching element, the third switching element, and the fourth switching element and causing the power source current to flow through the power circuit in the case of the activation preparation duration,
the controller determines that on-fixation defect has occurred in which the third switching element is firmly fixed to an on state and not turned off, upon detection of the power source current by the current sensor,
when turning on the third switching element and turning off the first switching element, the second switching element, and the fourth switching element and causing the power source current to flow through the power circuit in the case of the activation preparation duration,
the controller determines that on-fixation defect has occurred in which the first switching element is firmly fixed to an on state and not turned off, upon detection of the power source current by the current sensor.

11. The power source switch control device according to claim 1, further comprising:
a voltage monitoring circuit configured to detect load voltage of the power circuit, wherein
when turning off the first switching element and turning on the second switching element, the third switching element, and the fourth switching element and causing the power source current to flow through the power circuit in the case of the system stop duration,
the controller determines that on-fixation defect has occurred in which the first switching element is firmly fixed to an on state and not turned off, upon no detection of a reduction of the load voltage by the voltage monitoring circuit,
when turning off the third switching element and turning on the first switching element, the second switching element, and the fourth switching element and causing the power source current to flow through the power circuit in the case of the system stop duration,
the controller determines that on-fixation defect has occurred in which the third switching element is firmly fixed to an on state and not turned off, upon no detection of a reduction of the load voltage by the voltage monitoring circuit.

12. The power source switch control device according to claim 1, wherein the controller is commonly connected to the first detection unit, the second detection unit, the third detection unit, and the fourth detection unit.

13. The power source switch control device according to claim 12, wherein the controller is further commonly connected to the fifth detection unit, which comprises a current sensor configured to detect the power source current flowing through the power circuit and a voltage monitoring circuit configured to detect load voltage of the power circuit.

* * * * *